United States Patent
Guo

(10) Patent No.: US 10,683,439 B2
(45) Date of Patent: Jun. 16, 2020

(54) POLISHING COMPOSITION AND METHOD OF POLISHING A SUBSTRATE HAVING ENHANCED DEFECT INHIBITION

(71) Applicant: Rohm and Haas Electronic Materials CMP Holdings, Inc., Newark, DE (US)

(72) Inventor: Yi Guo, Newark, DE (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 357 days.

(21) Appl. No.: 15/922,054

(22) Filed: Mar. 15, 2018

(65) Prior Publication Data

US 2019/0284435 A1 Sep. 19, 2019

(51) Int. Cl.
*C09G 1/02* (2006.01)
*B24B 37/04* (2012.01)
*H01L 21/3105* (2006.01)

(52) U.S. Cl.
CPC .............. *C09G 1/02* (2013.01); *B24B 37/044* (2013.01); *H01L 21/31053* (2013.01)

(58) Field of Classification Search
CPC ...... C09G 1/02; B24B 37/44; H01L 21/31053
See application file for complete search history.

(56) References Cited

U.S. PATENT DOCUMENTS

| | | | |
|---|---|---|---|
| 5,139,571 A | 8/1992 | Deal et al. | |
| 6,852,009 B2 | 2/2005 | Kawase et al. | |
| 7,446,046 B2 | 11/2008 | Zhang et al. | |
| 7,452,481 B2 | 11/2008 | Suzuki et al. | |
| 8,026,201 B2 * | 9/2011 | Zhang | G03F 7/426 134/1.3 |
| 8,431,490 B2 | 4/2013 | Guo et al. | |
| 2002/0128164 A1 * | 9/2002 | Hara | C11D 3/3947 510/175 |
| 2004/0186206 A1 | 9/2004 | Yoneda et al. | |
| 2005/0031789 A1 | 2/2005 | Liu et al. | |
| 2005/0066585 A1 | 3/2005 | Bian et al. | |
| 2005/0148291 A1 | 7/2005 | Ohashi et al. | |
| 2005/0205837 A1 | 9/2005 | Miwa | |
| 2007/0004322 A1 | 1/2007 | Ohashi et al. | |
| 2015/0287608 A1 * | 10/2015 | Yang | C09K 13/06 438/746 |

FOREIGN PATENT DOCUMENTS

WO 2007/130350 A1 11/2007

* cited by examiner

*Primary Examiner* — Anita K Alanko
(74) *Attorney, Agent, or Firm* — John J. Piskorski

(57) ABSTRACT

A chemical mechanical polishing composition, including, as initial components: water; an abrasive; an inorganic salt of an alkali metal or an ammonium salt or mixtures thereof; a benzyltrialkyl quaternary ammonium compound having formula (I):

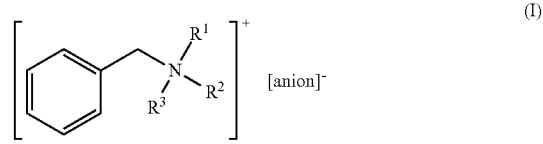

wherein $R^1$, $R^2$ and $R^3$ are each independently chosen from a ($C_1$-$C_4$)alky group; an anion; and, a hydroxyl-containing quaternary ammonium compound having formula (II):

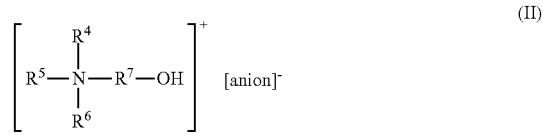

wherein $R^4$, $R^5$, $R^6$ is each independently chosen from H and an alkyl group; wherein $R^7$ is an alkylene group; and anions. Also disclosed are methods for polishing a substrate with the chemical mechanical polishing composition.

8 Claims, No Drawings

POLISHING COMPOSITION AND METHOD OF POLISHING A SUBSTRATE HAVING ENHANCED DEFECT INHIBITION

FIELD OF THE INVENTION

The present invention is directed to a polishing composition and method of polishing a substrate having enhanced defect reduction with good dielectric removal rate. More specifically, the present invention is directed to a polishing composition and method of polishing a substrate having enhanced defect reduction with good dielectric removal rate, wherein the polishing composition includes a combination of certain quaternary nitrogen compounds to enhance the reduction of defects on substrates which include dielectrics of silicon oxide, and wherein at least some of the silicon oxide is removed from the substrate.

BACKGROUND OF THE INVENTION

In the fabrication of integrated circuits and other electronic devices, multiple layers of conducting, semiconducting and dielectric materials are deposited on or removed from a surface of a semiconductor wafer. Thin layers of conducting, semiconducting, and dielectric materials can be deposited by a number of deposition techniques. Common deposition techniques in modern processing include physical vapor deposition (PVD), also known as sputtering, chemical vapor deposition (CVD), plasma-enhanced chemical vapor deposition (PECVD), and electrochemical plating (ECP).

As layers of materials are sequentially deposited and removed, the uppermost surface of the wafer becomes non-planar. Because subsequent semiconductor processing (e.g., metallization) requires the wafer to have a flat surface, the wafer needs to be planarized. Planarization is useful in removing undesired surface topography and surface defects, such as rough surfaces, agglomerated materials, crystal lattice damage, scratches, and contaminated layers or materials.

Chemical mechanical planarization, or chemical mechanical polishing (CMP), is a common technique used to planarize substrates, such as semiconductor wafers. In conventional CMP, a wafer is mounted on a carrier assembly and positioned in contact with a polishing pad in a CMP apparatus. The carrier assembly provides a controllable pressure to the wafer, pressing it against the polishing pad. The pad is moved (e.g., rotated) relative to the wafer by an external driving force. Simultaneously therewith, a polishing composition ("slurry") or other polishing solution is provided between the wafer and the polishing pad. Thus, the wafer surface is polished and made planar by the chemical and mechanical action of the pad surface and slurry.

Certain advanced device designs demand polishing compositions that provide enhanced silicon oxide removal efficiency at lower point-of-use (POU) abrasive wt % as well as reduced scratch defects for the improvement of polishing processes throughout and product yield %. As the size of structures on semiconductors devices continue to shrink, performance criteria which was once acceptable for planarizing and reducing defects of polishing dielectric materials becomes increasingly less acceptable. Scratches which were once considered acceptable are today becoming yield limiting.

Accordingly, there is a need for polishing compositions and polishing methods that exhibit desirable planarization efficiency, uniformity, and dielectric removal rate while minimizing defects such as scratches.

SUMMARY OF THE INVENTION

The present invention provides a chemical mechanical polishing composition, comprising, as initial components: water; an abrasive; an inorganic salt of an alkali metal or ammonium or mixtures thereof; a benzyltrialkyl quaternary ammonium compound having formula (I):

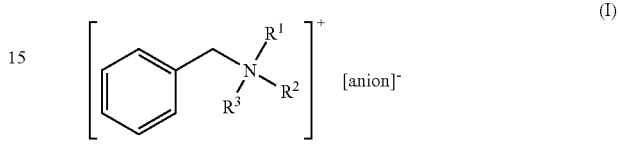

wherein $R^1$, $R^2$ and $R^3$ are each independently chosen from a ($C_1$-$C_4$)alky group; and, a hydroxyl-containing quaternary ammonium compound having formula (II):

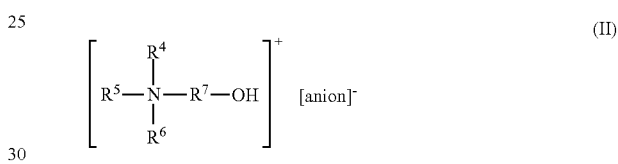

wherein $R^4$, $R^5$, $R^6$ is each independently chosen from H and an alkyl group; and, wherein $R^7$ is an alkylene group.

The present invention also provides a chemical mechanical polishing composition, comprising, as initial components: water; 0.1 to 40 wt % of an abrasive; 0.001 to 5 wt % of an inorganic salt of an alkali metal or ammonium or mixtures thereof; 0.001 to 1 wt % of a benzyltrialkyl quaternary ammonium compound having formula (I); wherein the anion of formula (I) is an anion that balances the + charge on the cation of formula (I); and, 0.001 to 1 wt % of a hydroxyl-containing quaternary ammonium compound having formula (II); wherein the anion in formula (II) is be an anion that balances the + charge on the cation in formula (II).

The present invention further provides a chemical mechanical polishing composition, comprising, as initial components: water; 5 to 25 wt % of an abrasive, wherein the abrasive is a colloidal silica abrasive having an average particle size of 20 to 200 nm; 0.01 to 2 wt % of an inorganic salt of an alkali metal or ammonium or mixtures thereof, wherein alkali metals are chosen from one or more of lithium, sodium, potassium, cesium and counter-anions are chosen from one or more of nitrate, carbonate, bicarbonate, halide, phosphate, biphosphate, pyrophosphate, triphosphate and sulfate; 0.01 to 1 wt % of a benzyltrialkyl quaternary ammonium compound having formula (I), wherein the anion in formula (I) is chosen from one or more of hydroxide, halide, nitrate, carbonate, sulfate, phosphate and acetate; and, 0.001 to 1 wt % of a hydroxyl-containing quaternary ammonium compound having formula (II), wherein the anion of formula (II) is chosen from one or more of hydroxide, halide, nitrate, carbonate, sulfate, phosphate and acetate.

The present invention provides a method for chemical mechanical polishing of a substrate, comprising: providing a substrate, wherein the substrate comprises silicon oxide;

providing a chemical mechanical polishing composition, comprising, as initial components: water; an abrasive; an inorganic salt of an alkali metal or ammonium or mixtures thereof; a benzyltrialkyl quaternary ammonium compound having (I):

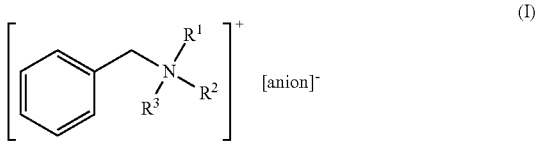

wherein $R^1$, $R^2$ and $R^3$ are each independently chosen from a ($C_1$-$C_4$)alky group; and, a hydroxyl-containing quaternary ammonium compound having formula (II):

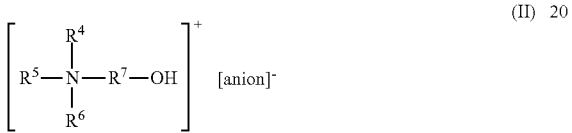

wherein $R^4$, $R^5$, $R^6$ is each independently chosen from H and an alkyl group; wherein $R^7$ is an alkylene group.

The present invention also provides a method for chemical mechanical polishing of a substrate, comprising: providing a substrate, wherein the substrate comprises silicon oxide; providing a chemical mechanical polishing composition, comprising, as initial components: water; an abrasive; an inorganic salt of an alkali metal or ammonium or mixtures thereof; a benzyltrialkyl quaternary ammonium compound having a formula (I):

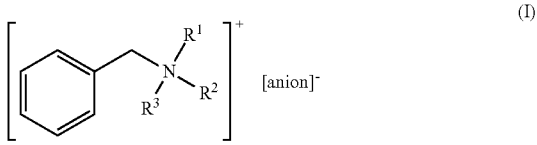

wherein $R^1$, $R^2$ and $R^3$ are each independently chosen from a ($C_1$-$C_4$) alky group; and, hydroxyl-containing quaternary ammonium compound having formula (II):

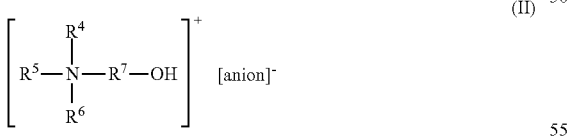

wherein $R^4$, $R^5$, $R^6$ is each independently chosen from H and a ($C_1$-$C_4$)alkyl group; wherein $R^7$ is an ($C_1$-$C_4$)alkylene group; and, optionally, adding a pH adjusting agent to the composition to adjust a pH of the chemical mechanical polishing composition to >7.

The present invention also provides a method for chemical mechanical polishing a substrate, comprising: providing a substrate, wherein the substrate comprises at least one silicon oxide layer; providing a chemical mechanical polishing composition as described above; providing a chemical mechanical polishing pad with a polishing surface; creating dynamic contact at an interface between the polishing surface of the chemical mechanical polishing pad and the substrate with a down force of 0.69 to 69 kPa; and dispensing the chemical mechanical polishing composition onto the chemical mechanical polishing pad at or near the interface between the chemical mechanical polishing pad and the substrate; wherein the chemical mechanical polishing composition provided has a pH of >7; and wherein the substrate is polished.

The chemical mechanical polishing composition and method of the present invention enable enhanced reduction of defects, enable good silicon oxide removal rate and the chemical mechanical polishing composition is stable.

DETAILED DESCRIPTION OF THE INVENTION

As used throughout this specification the following abbreviations have the following meanings, unless the context indicates otherwise: ° C.=degrees Centigrade; g=grams; L=liters; mL=milliliters; µ=µm=microns; kPa=kilopascal; A=angstroms; mm=millimeters; cm=centimeter; nm=nanometers; min=minute; rpm=revolutions per minute; lbs=pounds; kg=kilograms; wt %=percent by weight; RR=removal rate; PS=Polishing Slurry of the Invention; PC=Comparative Polishing Slurry.

The term "chemical mechanical polishing" or "CMP" refers to a process where a substrate is polished by means of chemical and mechanical forces alone and is distinguished from electrochemical-mechanical polishing (ECMP) where an electric bias is applied to the substrate. The term "TEOS" means the silicon oxide formed from the decomposition of tetraethyl orthosilicate ($Si(OC_2H_5)_4$). The term "composition" and "slurry" are used interchangeably through-out the specification. The term "halide" means chloride, bromide, fluoride and iodide. The terms "a" and "an" refer to both the singular and the plural. All percentages are by weight, unless otherwise noted. All numerical ranges are inclusive and combinable in any order, except where it is logical that such numerical ranges are constrained to add up to 100%.

The chemical mechanical polishing method of the present invention is useful for polishing a substrate comprising silicon oxide. The chemical mechanical polishing composition used in the method of the present invention contains (preferably consists of) water; an inorganic salt of an alkali metal or ammonium at a concentration to enhance the silicon oxide removal rate; and a benzyltrialkyl quaternary ammonium compound to reduce defects having formula (I):

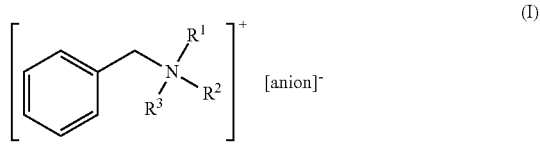

wherein $R^1$, $R^2$ and $R^3$ are each independently selected from a ($C_1$-$C_4$)alky group; and a hydroxyl-containing quaternary ammonium compound to reduce defects having a formula (II):

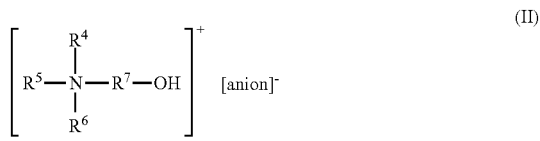

wherein $R^4$, $R^5$, $R^6$ is each independently chosen from H and an alkyl group; wherein $R^7$ is an alkylene group; and, optionally, adding a pH adjusting agent to the composition as necessary to adjust the pH of the chemical mechanical polishing composition to >7.

The term "enhanced silicon oxide removal rate" used herein and in the appended claims to describe the removal rate of silicon oxide (for removal rate measured in Å/min) resulting from the addition of an inorganic salt to the chemical mechanical polishing composition means that at least the following expression is satisfied:

$$A > A_0$$

wherein A is the silicon oxide removal rate in Å/min for a chemical mechanical polishing composition containing a claimed inorganic salt used in the method of the present invention, as measured under the polishing conditions set forth in the Examples; $A_0$ is the silicon oxide removal rate in Å/min obtained under identical conditions with only silica abrasives present.

The term "improved polishing defectivity performance" used herein and in the appended claims to describe the defectivity performance obtained through the inclusion of a compound having formula (I) and a compound having formula (II) in combination in the chemical mechanical polishing composition used for the chemical mechanical polishing method of the present invention means that at least the following expression is satisfied:

$$X < X_0$$

wherein X is the defectivity (i.e., post CMP/hydrogen fluoride (HF) scratches) for a chemical mechanical polishing composition containing the substances used in the method of the present invention, as measured under the polishing conditions set forth in the Examples; and $X_0$ is the defectivity (i.e., post CMP/hydrogen fluoride scratches) obtained under identical conditions with only silica abrasives present.

The water contained in the chemical mechanical polishing composition used in the chemical mechanical polishing method of the present invention is preferably at least one of deionized and distilled to limit incidental impurities.

The chemical mechanical polishing composition used in the chemical mechanical polishing method of the present invention contains 0.1 to 40 wt % abrasive; preferably, 5 to 25 wt % abrasive, more preferably, 8 to 12 wt %. The abrasive used preferably has an average particle size of <200 nm; more preferably 75 to 150 nm; most preferably 100 to 150 nm.

Abrasives for use in the chemical mechanical polishing composition used in the chemical mechanical polishing method of the present invention include, for example, inorganic oxides, inorganic hydroxides, inorganic hydroxide oxides, metal borides, metal carbides, metal nitrides, polymer particles and mixtures comprising at least one of the foregoing. Suitable inorganic oxides include, for example, silica ($SiO_2$), alumina ($Al_2O_3$), zirconia ($ZrO_2$), ceria ($CeO_2$), manganese oxide ($MnO_2$), titanium oxide ($TiO_2$) or combinations thereof. Modified forms of these inorganic oxides, such as, organic polymer coated inorganic oxide particles and inorganic coated particles can also be utilized if desired. Suitable metal carbides, borides and nitrides include, for example, silicon carbide, silicon nitride, silicon carbonitride (SiCN), boron carbide, tungsten carbide, zirconium carbide, aluminum boride, tantalum carbide, titanium carbide, or combinations thereof.

The preferred abrasive for use in the chemical mechanical polishing composition used in the chemical mechanical polishing method of the present invention is colloidal silica. Preferably, the colloidal silica used contains at least one of precipitated silica and agglomerated silica. Preferably, the colloidal silica used has an average particle size of <200 nm, more preferably, 75 to 150 nm, most preferably, 100 to 150 nm; and accounts for 0.1 to 40 wt %, preferably, 5 to 25 wt %, more preferably, 8 to 12 wt % of the chemical mechanical polishing composition. Examples of commercially available colloidal silica are Klebosol™ II 1630 colloidal silica with 139 nm average particle size; Klebosol™ II 1630 colloidal silica with 145 nm average particles size; and Klebosol™ II 1730 colloidal silica with 130 nm particle size all manufactured by Merck KgAA, Darmstadt, Germany, all available from The Dow Chemical Company.

The chemical mechanical polishing composition includes one or more inorganic salts of alkali metals and ammonium. Preferably, the amount of inorganic salt is included in the chemical mechanical polishing composition in amounts of 0.01 to 2 wt %, preferably, 0.1 to 1 wt %, more preferably from 0.1 to 0.5 wt %, most preferably, from 0.2 wt % to 0.4 wt %, wherein alkali metals are chosen from one or more of lithium, sodium, potassium, cesium and counter-anions are chosen from one or more of nitrate, carbonate, bicarbonate, halide, phosphate, biphosphate, pyrophosphate, triphosphate and sulfate. A most preferred inorganic salt is potassium carbonate.

The chemical mechanical polishing composition used in the chemical mechanical polishing method of the present invention preferably contains, as an initial component, 0.001 to 5 wt % of a compound having formula I

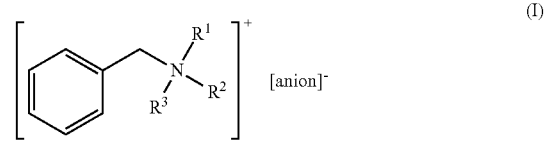

wherein $R^1$, $R^2$ and $R^3$ are each independently chosen from a ($C_1$-$C_4$)alky group, preferably, a ($C_1$-$C_2$)alkyl group, most preferably a methyl group; and wherein the anion is a counter anion to neutralize the + charge of the benzyltrimethylammonium cation, wherein the anion is hydroxide, halide, nitrate, carbonate, sulfate, phosphate or acetate, preferably, the anion is hydroxide or a halide. The chemical mechanical polishing composition of the present invention also contains, as an initial component, 0.001 to 1 wt %, more preferably 0.1 to 1 wt %, most preferably 0.1 to 0.3 wt % of the compound having formula (I). Most preferably, the compound having formula (I) is benzyltrimethylammonium chloride.

The chemical mechanical polishing composition used in the chemical mechanical polishing method of the present invention further contains, as an initial component, a compound having formula (II):

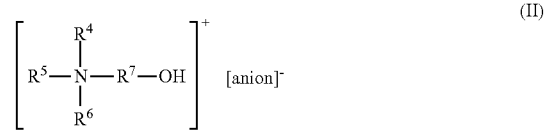

wherein $R^4$, $R^5$, $R^6$ is each independently chosen from H and an alkyl group, preferably, a ($C_1$-$C_4$)alkyl group, more preferably, from a ($C_1$-$C_2$) alkyl group, most preferably, methyl groups; wherein $R^7$ is an alkylene group; $R^7$ is preferably chosen from ($C_1$-$C_4$) alkylene group, more preferably $R^7$ is chosen from one of methylene and ethylene, most preferably, $R^7$ is ethylene; and the anion neutralizes the + charge of the hydroxyl-containing quaternary ammonium cation, wherein the anion is hydroxide, halide, nitrate, carbonate, sulfate, phosphate or acetate, preferably, the anion is hydroxide or a halide, most preferably, the anion is chloride.

Inclusion of the compound having formula (II) in the chemical mechanical polishing composition used in the chemical mechanical polishing method of the present invention facilitates reducing defects on silicon oxide, improves the polishing performance in terms of enhanced removal rate on silicon oxide, and helps the stabilization of colloidal silica in presence of inorganic salts. The chemical mechanical polishing composition of the present invention also contains, as an initial component, 0.001 to 1 wt %, more preferably 0.1 to 1 wt %, most preferably 0.2 to 0.3 wt % of the compound having formula (II).

Optionally, the chemical mechanical polishing composition used in the chemical mechanical polishing method of the present invention further contains additional additives chosen from one or more of buffers, anti-foaming agents and biocides.

The chemical mechanical polishing composition used in the chemical mechanical polishing method of the present invention has a pH of >7, preferably 7 to 12, more preferably 10 to 11. The chemical mechanical polishing composition used can optionally include one or more pH adjusting agent to maintain the pH within a preferred range. Preferably, the pH adjusting agent is chosen from one or more of sodium hydroxide, potassium hydroxide, and ammonia.

The substrate polished in the chemical mechanical polishing method of the present invention comprises silicon oxide. The silicon oxide in the substrate includes, but is not limited to, borophosphosilicate glass (BPSG), plasma etched tetraethyl ortho silicate (PETEOS), thermal oxide, undoped silicate glass, high density plasma (HDP) oxide.

Optionally, the substrate polished in the chemical mechanical polishing method of the present invention further comprises silicon nitride. The silicon nitride in the substrate, if present, includes, but is not limited to, silicon nitride material, such as, $Si_3N_4$.

The chemical mechanical polishing pad used in the chemical mechanical polishing method of the present invention can by any suitable polishing pad known in the art. The chemical mechanical polishing pad can, optionally, be chosen from woven and non-woven polishing pads. The chemical mechanical polishing pad can be made of any suitable polymer of varying density, hardness, thickness, compressibility and modulus. The chemical mechanical polishing pad can be grooved and perforated as desired.

The slurry compositions of the present invention used in the chemical mechanical polishing method of the present invention enhances the removal rate of silicon oxide (as measured in angstroms per minute, Å/min). If we define the relative enhancement ($\Delta A$) of the removal rate of silicon oxide as $\Delta A = (A-A_0)/A_0$, wherein A and $A_0$ stand for the removal rates of silicon oxide, measured in Å/min using a polishing composition with (A) and without ($A_0$) the addition of at least the compounds of formula (I) and formula (II) and an inorganic salt (preferably potassium carbonate) in the chemical mechanical polishing composition. Inclusion of compounds of formula (I) and formula (II) and an inorganic salt (preferably potassium carbonate) in the chemical mechanical polishing composition used in the method of the present invention preferably provides either >5%, more preferably >10%, enhancement in the silicon oxide removal rate. That is, at least one of the following equations is preferably satisfied:

$$(((A-A_0)/A_0)*100) > 5; \text{ and} \quad (i)$$

$$(((A-A_0)/A_0)*100) > 10, \quad (ii)$$

all as measured under the polishing conditions set forth in the Examples.

The compound having formula (I) (most preferably benzyltrimethylammonium chloride) and the compound having formula (II) (most preferably choline chloride) contained in the chemical mechanical polishing composition used in the chemical mechanical polishing method of the present invention results in an improved polishing defectivity performance. Preferably, the inclusion of the compounds having formula (I) and formula (II) in the chemical mechanical polishing composition, as an initial component, provides a >50%; more preferably >60%; most preferably >70% reduction in polishing defectivity (i.e., post CMP/hydrogen fluoride scratches), as measured under the polishing conditions set forth in the Examples. That is, at least one of the following equations is preferably satisfied:

$$(X_0-X)/X*100 > 50; \quad (i)$$

$$(X_0-X)/X*100 > 60; \text{ and,} \quad (ii)$$

$$(X_0-X)/X*100 > 70; \quad (iii)$$

wherein X is the polishing defectivity (i.e., post CMP/hydrogen fluoride scratches) for a chemical mechanical polishing composition containing the substance according to formula (I) and formula (II) and used in the method of the present invention, as measured under the polishing conditions set forth in the Examples; and $X_0$ is the polishing defectivity (i.e., post CMP/hydrogen fluoride scratches) obtained under identical conditions with only silica abrasives present; or silica and an inorganic salt; or a compound of formula (I) with silica and an inorganic salt.

The chemical mechanical polishing composition used in the chemical mechanical polishing method of the present invention enables operation with a low nominal polishing pad pressure, for example at 3 to 35 kPa. The low nominal polishing pad pressure improves polishing performance by reducing scratching and other undesired polish defects and minimizes damage to fragile materials.

The following examples are intended to illustrate the present invention but are not intended to limits its scope.

In the following Examples, unless otherwise indicated, conditions of temperature and pressure are ambient temperature and standard pressure.

The following materials were used in the Examples that follow:
PC=Potassium Carbonate, 99.9 wt. % (Aldrich).
CC=Choline chloride, 99% (Aldrich)
BTMAC=Benzyltrimethylammonium chloride (60%, Starchem. Inc.)

The polishing removal rate experiments were performed on eight inch blanket wafers. An Applied Materials Mirra® polisher was used for all examples. All polishing experiments were performed using an VisionPad 5000™ polyurethane polishing pad (commercially available from Rohm and Haas Electronic Materials CMP Inc.) with a down force of 34.5 kPa (5 psi), a chemical mechanical polishing slurry composition flow rate of 125 mL/min, a table rotation speed of 93 rpm and a carrier rotation speed of 87 rpm. The removal rates were determined by measuring the film thickness before and after polishing using a KLA-Tencor FX200 metrology tool. The defectivity performances reported in the Examples was determined using a Scanning Electron Microscope after a hydrogen fluoride post polishing wash ("Pst HF"). All the TEOS wafers after Pst-HF wash were inspected using a Surfscan® SP2 defect inspection system available from KLA-Tencor. The defects information, including their coordinates on the wafer, was recorded in KLARF (KLA Results File) which was then transferred to eDR-5200 defect review system available from KLA-Tencor. A random sample of 100 defect images were selected and reviewed by eDR-5200 system. These 100 images were classified into various defect types, for example, chatter marks (scratches), particles and pad debris. Based on classification results from these 100 images, the total number of scratches on the wafer was determined.

Example 1

Chemical Mechanical Polishing Compositions of the Present Invention

The following chemical mechanical polishing compositions of the present invention are polishing slurries and were prepared to include the components and amounts disclosed in Table 1 below. The components were combined with the balance being deionized water without further adjustment of the pH.

TABLE 1

| Polishing Slurry | Abrasive 1* (wt %) | Abrasive 2$^£$ (wt %) | PC (wt %) | CC (wt %) | BTMAC (wt %) | pH |
|---|---|---|---|---|---|---|
| PS-1 | 10.5 | 0 | 0.25 | 0.25 | 0.25 | 10.8 |
| PS-2 | 10.5 | 0 | 0.3 | 0.2 | 0.1 | 10.8 |
| PS-3 | 10.5 | 0 | 0.2 | 0.2 | 0.2 | 10.8 |
| PS-4 | 10.5 | 0 | 0.4 | 0.2 | 0.2 | 10.9 |
| PS-5 | 0 | 10.5 | 0.3 | 0.2 | 0.1 | 10.9 |
| PS-6 | 0 | 10.5 | 0.25 | 0.25 | 0.25 | 10.9 |
| PS-7 | 0 | 10.5 | 0.2 | 0.3 | 0.1 | 10.9 |

*Abrasive1: Klebosol™ II 1630 colloidal silica with 139 nm average particle size manufactured by Merck KgAA, Darmstadt, Germany, available from The Dow Chemical Company; and
$^£$Abrasive2: Klebosol™ II 1630 colloidal silica with 145 nm average particle size manufactured by Merck KgAA, Darmstadt, Germany, available from The Dow Chemical Company.

Example 2

Comparative Chemical Mechanical Polishing Compositions

The following comparative chemical mechanical polishing compositions are polishing slurries and were prepared to include the components and amounts disclosed in Table 2 below. The components were combined with the balance being deionized water without further adjustment of the pH.

TABLE 2

| Comparative Polishing Slurry | Abrasive 1* (wt %) | Abrasive 2$^j$ (wt %) | Abrasive 3$^£$ (wt %) | PC (wt %) | BTMAC (wt %) | pH |
|---|---|---|---|---|---|---|
| PC-1 | 10.5 | 0 | 0 | 0.3 | 0.3 | 10.9 |
| PC-2 | 10.5 | 0 | 0 | 0.2 | 0.2 | 10.7 |
| PC-3 | 0 | 15.5 | 0 | 0 | 0 | 10.7 |
| PC-4 | 10.5 | 0 | 0 | 0 | 0 | 10.7 |
| PC-5 | 0 | 10.5 | 0 | 0 | 0 | 10.7 |

*Abrasive1: Klebosol™ II 1630 colloidal silica with 139 nm average particle size manufactured by Merck KgAA, Darmstadt, Germany, available from The Dow Chemical Company;
$^j$Abrasive2: Klebosol™ II 1730 colloidal silica with 130 nm average particle size manufactured by Merck KgAA, Darmstadt, Germany, available from The Dow Chemical Company; and
$^£$Abrasive3: Klebosol™ II 1630 colloidal silica with 145 nm average particle size manufactured by Merck KgAA, Darmstadt, Germany, available from The Dow Chemical Company Abrasive.

Example 3

TEOS Removal Rate and Defect Performance

The TEOS removal rate and the defect performance of the chemical mechanical polishing slurry compositions of the present invention of Table 1 above in Example 1 were compared to the TEOS removal rate and the defect performance of the comparative slurries disclosed in Table 2 above in Example 2. The performance results are in Table 3 below.

TABLE 3

| Polishing Slurry | TEOS RR (Å/min) | Pst-HF Total Defects | Pst-HF Scratches |
|---|---|---|---|
| PS-1 | 3762 | 65 | 12 |
| PS-1 | 3712 | 97 | 7 |
| PS-1 | 3722 | 84 | 10 |
| PS-2 | 3373 | 67 | 14 |
| PS-2 | 3412 | 49 | 12 |
| PS-2 | 3474 | 49 | 18 |
| PS-3 | 3643 | 74 | 15 |
| PS-4 | 3612 | 67 | 9 |
| PS-5 | 3765 | 30 | 6 |
| PS-6 | 3765 | 82 | 6 |
| PS-7 | 3727 | 52 | 8 |
| PC-1 | 3798 | 99 | 44 |
| PC-1 | 3752 | 84 | 49 |
| PC-1 | 3764 | 93 | 27 |
| PC-2 | 3015 | 917 | 9 |
| PC-2 | 3040 | 141 | 51 |
| PC-2 | 3143 | 113 | 36 |
| PC-3 | 3760 | 90 | 20 |
| PC-4 | 2669 | 466 | 374 |
| PC-5 | 2965 | 328 | 239 |

What is claimed is:
1. A chemical mechanical polishing composition, comprising, as initial components:
water;
an abrasive;
an inorganic salt of an alkali metal or ammonium or mixtures thereof;

a benzyltrialkyl quaternary ammonium compound having formula (I):

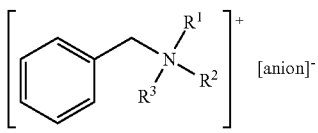

wherein $R^1$, $R^2$ and $R^3$ are each independently chosen from a ($C_1$-$C_4$)alky group; and a hydroxyl-containing quaternary ammonium compound having formula (II):

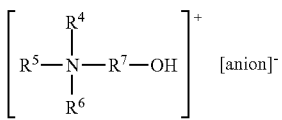

wherein $R^4$, $R^5$, $R^6$ is each independently chosen from H and an alkyl group; wherein $R^7$ is an alkylene group.

2. The chemical mechanical polishing composition of claim 1, wherein the chemical mechanical polishing composition comprises, as initial components:
water;
0.1 to 40 wt % of the abrasive;
0.001 to 5 wt % of inorganic salt of an alkali metal or ammonium or mixtures thereof;
0.001 to 1 wt % of benzyltrialkyl quaternary ammonium compound having formula (I); and,
0.001 to 1 wt % of the hydroxyl-containing quaternary ammonium compound having formula (II).

3. The chemical mechanical polishing composition of claim 1, wherein the chemical mechanical polishing composition comprises, as initial components:
water;
0.1 to 40 wt % of the abrasive;
0.001 to 5 wt % of inorganic salt of an alkali metal or an ammonium salt or mixtures thereof, wherein the alkali metal is chosen from one or more of $Li^+$, $Na^+$, $K^+$, and $Cs^+$; and anions are chosen from one or more of nitrate, carbonate, halide, bicarbonate, phosphate, biphosphate, pyrophosphate, triphosphate, sulfate;
0.001 to 1 wt % of benzyltrialkyl quaternary ammonium compound having formula (I), wherein the anion in formula (I) is chosen from one or more of hydroxide, halide, nitrate, sulfate, phosphate, acetate;
0.001 to 1 wt % of a hydroxyl-containing quaternary ammonium compound having formula (II), wherein the anion of formula (II) is chosen from one or more of hydroxide, halide, nitrate, sulfate, phosphate, acetate.

4. The chemical mechanical polishing slurry composition of claim 1, wherein a pH of the chemical mechanical polishing composition is >pH 7.

5. A method for chemical mechanical polishing of a substrate, comprising:
providing a substrate, wherein the substrate comprises silicon oxide;
providing a chemical mechanical polishing composition according to claim 1;
providing a chemical mechanical polishing pad with a polishing surface;
creating dynamic contact at an interface between the polishing surface of the chemical mechanical polishing pad and the substrate with a down force of 0.69 to 69 kPa; and
dispensing the chemical mechanical polishing composition onto the chemical mechanical polishing pad at or near the interface between the chemical mechanical polishing pad and the substrate;
wherein the chemical mechanical polishing composition provided has a pH of >7;
wherein the substrate is polished; and, wherein at least some of the silicon oxide is removed from the substrate.

6. The method of claim 5, wherein the chemical mechanical polishing composition provided comprises, as initial components:
water;
0.1 to 40 wt % of the abrasive, wherein the abrasive is a colloidal silica abrasive having an average particle size of 20 to 200 nm;
0.001 to 5 wt % of inorganic salt of an alkali metal or an ammonium salt
0.001 to 1 wt % of benzyltrialkyl quaternary ammonium compound having formula (I); and,
0.001 to 1 wt % of the hydroxyl-containing quaternary ammonium compound having formula (II),
wherein the chemical mechanical polishing composition provided has a pH>7.

7. The method of claim 6, wherein the substrate comprises silicon oxide and wherein the chemical mechanical polishing composition exhibits a silicon oxide removal rate of 1,000 to 6,000 Å/min.

8. The method of claim 6, wherein the substrate comprises silicon oxide and wherein the chemical mechanical polishing slurry composition exhibits a pst-HF scratch defects <100 per wafer.

* * * * *